United States Patent
Chang et al.

(10) Patent No.: US 6,249,051 B1
(45) Date of Patent: Jun. 19, 2001

(54) COMPOSITE BUMP FLIP CHIP BONDING

(75) Inventors: Shyh-Ming Chang, Hsinchu; Chih-Chiang Chu, Taipei; Yu-Chi Lee, Taipei Hsien, all of (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 08/428,775

(22) Filed: Apr. 24, 1995

Related U.S. Application Data

(62) Division of application No. 08/239,380, filed on May 6, 1994, now Pat. No. 5,431,328.

(51) Int. Cl.$^7$ .................................................. H01L 23/52
(52) U.S. Cl. .......................... 257/737; 257/738; 257/778; 257/781; 257/783
(58) Field of Search ..................................... 257/690, 734, 257/738, 779, 780, 781, 782, 783, 642, 643, 778

(56) References Cited

U.S. PATENT DOCUMENTS

| | | | |
|---|---|---|---|
| 3,401,126 | 9/1968 | Miller et al. ........................ | 252/514 |
| 3,809,625 | 5/1974 | Brown et al. ......................... | 204/15 |
| 4,504,007 | * 3/1985 | Anderson, Jr. et al. ............. | 228/123 |
| 4,883,774 | * 11/1989 | Feilchenfeld et al. ................ | 430/325 |
| 4,916,523 | 4/1990 | Sokolovsky et al. .................. | 357/74 |
| 4,963,002 | 10/1990 | Tagusa et al. ........................ | 350/336 |
| 5,115,090 | * 5/1992 | Sachdev et al. ...................... | 528/353 |
| 5,134,460 | 7/1992 | Brady et al. ............................ | 357/71 |
| 5,397,863 | * 3/1995 | Afzali-Ardakani et al. ......... | 174/258 |

FOREIGN PATENT DOCUMENTS

| | | | |
|---|---|---|---|
| 2-180036 | * 7/1990 | (JP) ..................................... | 257/783 |

OTHER PUBLICATIONS

Craig et al., "Polyimide Coatings", Electronic Materials Handbook, vol. 1, Packaging, pp. 767–772, 1989.*

* cited by examiner

Primary Examiner—Olik Chaudhuri
Assistant Examiner—Alonzo Chambliss
(74) Attorney, Agent, or Firm—George O. Saile; Stephen B. Ackerman; Larry J. Prescott

(57) ABSTRACT

A bonded structure comprising the physical and electrical connections between an integrated circuit element and substrate using a composite bump comprised of a single polymer body of low Young's Modulus, a conductive barrier metal coating covering the polymer body and a soldering metal coating covering the conductive barrier metal coating. When the bonded structure is formed the composite bump is deformed and the low Young's Modulus of the polymer body allows a very reliable bonded structure with very low bonding force. Due to the low Young's Modulus there is little stress tending to break the solder joint after the bonded structure is formed. The bond is formed using a soldering process so that the soldering metal forms a conductive adhesive between the composite bumps and either the substrate input/output pads or the integrated circuit element input/output pads.

4 Claims, 4 Drawing Sheets

COMPOSITE BUMP FLIP CHIP BONDING

RELATED PATENT APPLICATIONS

This is a divisional application of Ser. No. 08/239,380, filed May 6, 1994, now U.S. Pat. No. 5,431,328.

Ser. No. 08/239,375, filed May 6, 1994 entitled Composite Bump Bonding; now abandoned and replaced by File Wrapper Continuing Application Ser. No. 08/518,182, filed Aug. 23, 1995 entitled Composite Bump Bonding and assigned to the same assignee.

Ser. No. 08/239,424, filed May 6, 1994 entitled Composite Bump Structure and Methods of Fabrication assigned to the same assignee; now U.S. Pat. No. 5,393,697 issued Feb. 28, 1995.

BACKGROUND OF THE INVENTION (1) Field of the Invention

The invention relates to the joining of integrated circuit elements to the next level of integration and more particularly to the formation of the bonded structure which comprises the physical and electrical connection between the integrated circuit element and the next level of integration.

(2) Description of the Related Art

In the manufacture of highly dense integrated circuits the formation of an inexpensive and highly reliable mechanical bond and electrical interconnection has long been recognized to be of key importance. Some time ago a solution to this need was patented by L. F. Miller et al in U.S. Pat. No. 3,401,126. This method worked well for many years but increasing levels of integration and circuit density have made the need for interconnections on an increasingly fine pitch of key importance.

Flip chip bonding has been done using several types of bumps. One type simply uses a lead-tin solder or indium alloy solder as the bump which bonds the integrated circuit chip to a substrate. This type of bonding can result in shorting between bumps during solder reflow. Another type of bump uses a copper ball within the lead-tin or indium alloy solder. The copper ball does not melt during solder reflow so there will not be a shorting. However since the copper ball is rigid there can be problems with cracking of joints. Another type of structure is a stack of solder bumps. This type of structure is not easily shorted during reflow and the cracking problem is not present. However, it is difficult to make fine pitch solder reflow joints with this method because of stack misalignment problems.

A method for achieving increased interconnection density was patented by K. Hatada in U.S. Pat. No. 4,749,120. This method employs a gold bump as the electrical interconnection between the integrated circuit chip and the substrate while holding the integrated circuit chip in place with a resin coating on the substrate acting as an adhesive between chip and substrate. This method has the disadvantage of a Young's Modulus for gold which is very high when compared to that of the resin. As a result of the Young's Modulus mismatch a very large bonding force is required between the integrated circuit chip and the substrate during the bump bonding process while the resin is undergoing its curing cycle. After the bonding process the gold bump will tend to return to its original shape and the recoil forces will disengage some of the bumps from the electrodes on the substrate. Another method patented by Y. Tagusa et al in U.S. Pat. No. 4,963,002 employs nickel plated plastic beads or silver particles to achieve the electrical connection but the former method suffers small contact surface area and the latter method has the further disadvantage of the relatively high Young's Modulus for silver.

U.S. Pat. No. 4,916,523 issued to Sokolovsky et al shows a unidirectional conductive adhesive to bond the integrated circuit chip to the substrate. U.S. Pat. No. 5,134,460 issued to Brady et al shows conductive metal bumps covered with a gold layer.

SUMMARY OF THE INVENTION

It is an object of this invention to provide a solder reflow bonded structure which is not easily shorted during solder reflow, does not easily crack after solder reflow and which easily accommodates a fine pitch solder reflow. This objective is accomplished with a composite bump included in a solder joint. The composite bump includes a single polymer body with a low Young's Modulus relative to that of metals and a conductive metal coating covering the polymer body. The bonded structure includes an integrated circuit element with input/output pads, a substrate with input/output pads, composite bumps which connect the integrated circuit element input/output pads and the substrate input/output pads, and soldering metal which forms the solder joint. The bonded structure is not easily shorted during a solder reflow bonding process, can accommodate a very fine pitch solder reflow easily, and does not easily crack after solder reflow is complete. The bonded structure of this invention forms the electrical and physical connections between integrated circuit elements and the corresponding substrate wherein very dense wiring patterns can be accommodated economically and the resulting connections are extremely reliable.

It is a further object of this invention to provide a method of forming a bonded structure which includes solder joints and composite bumps. This objective is achieved by forming composite bumps on the input/output pads of an integrated circuit element or substrate, forming a layer of soldering metal on the composite bumps, bringing the integrated circuit element and substrate together and heating the solder to solder reflow temperature. Alternatively the objective can be achieved by forming composite bumps on the input/output pads of an integrated circuit element or substrate, forming a layer of soldering metal on the input/output pads which do not have the composite bumps, bringing the integrated circuit element and substrate together and heating the solder to reflow temperature.

DESCRIPTION OF THE PREFERRED EMBODIMENTS

Figure 1:
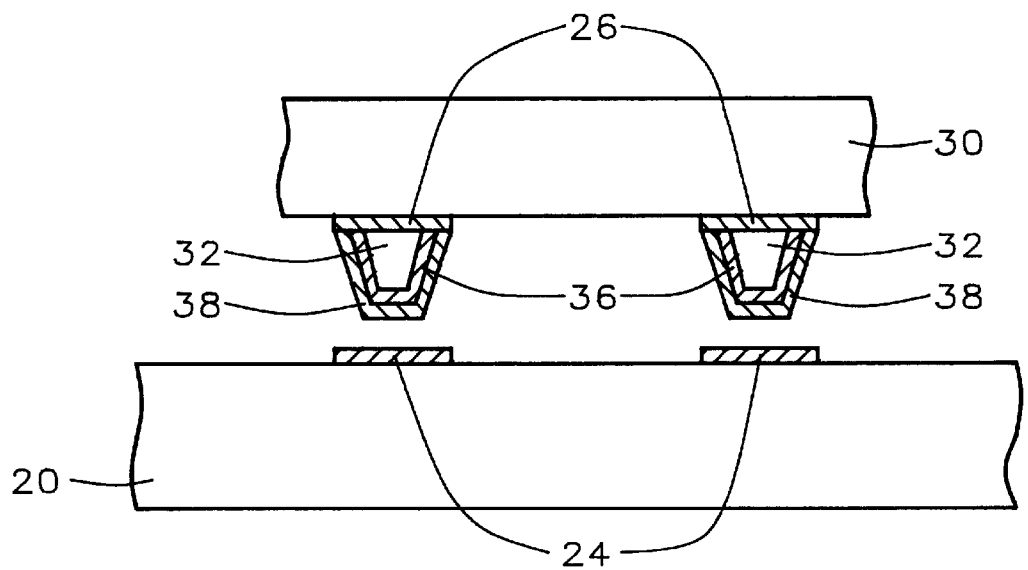
FIG. 1 is a cross sectional representation of composite bumps with a solder layer formed on the integrated circuit element input/output pads before soldering.
Figure 2:
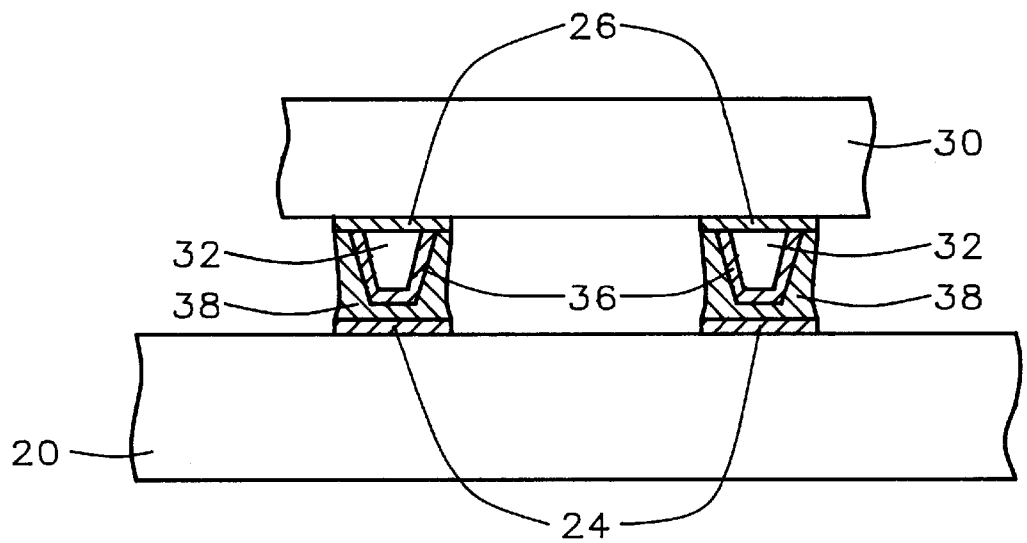
FIG. 2 is a cross sectional representation of structure after soldering where the composite bumps and the solder layer were formed on the integrated circuit element input/output pads prior to soldering.

Refer now more particularly to FIGS. 1 and 2, there is shown an embodiment for the bonded structure of the current invention. As shown in FIG. 1 composite bumps are formed on the integrated circuit element input/output pads 26 which are a metal such as aluminum about 90 microns in diameter. Each composite bump is composed of a polymer body 32 such as polyamic acid polyimide with a thickness between about 5 and 25 microns, a conductive metal coating 36 covering the polymer body, and a soldering metal coating 38 covering the conductive metal coating. The conductive metal coating must adhere to the polymer body and can be a composite such as chrome/copper/gold, chrome/nickel/gold, chrome/silver/gold, titanium/tungsten/gold, titanium/platinum/gold, or titanium/palladium/gold. For chrome/copper/gold the thickness can be about 500 Angstroms chrome/500 Angstroms copper/2000 Angstroms gold. The soldering metal layer can be metal alloys such as lead-tin, indium-gallium, or indium-tin. For lead-tin the soldering metal layer can be 95% lead-5% tin with a thickness of between about 1 and 20 microns. Substrate input/output pads 24 are formed on the substrate 20 and are formed from a metal the solder will wet such as chrome/copper/gold or other metal composites used for the conductive metal coating on the polymer body of the composite bump. FIG. 2 shows the bonded structure after soldering. The soldering metal 38 bonds the composite bump structure to the substrate input/output pads 24.

Figure 3:
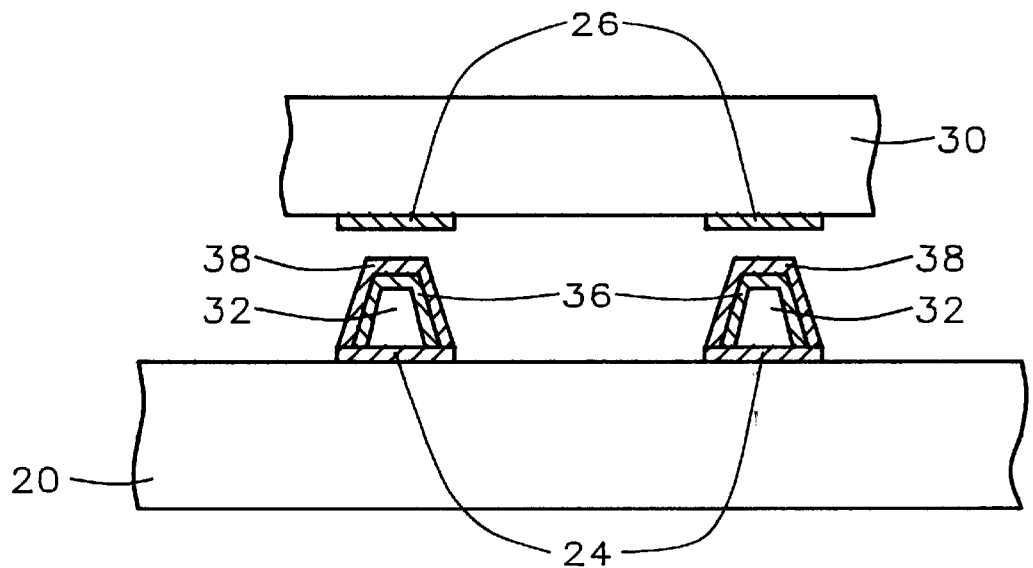
FIG. 3 is a cross sectional representation of composite bumps with a solder layer formed on the substrate input/output pads before soldering.
Figure 4:
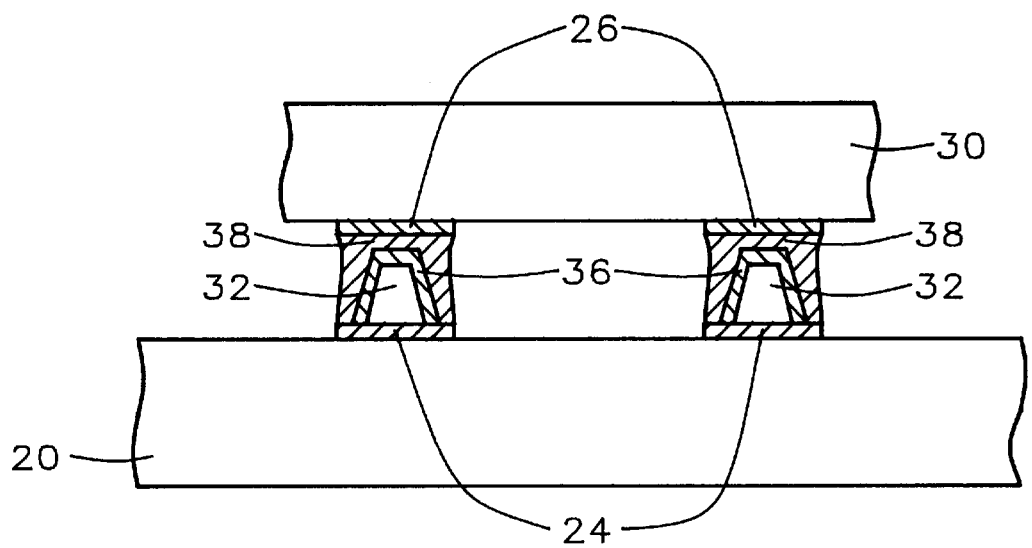
FIG. 4 is a cross sectional representation of structure after soldering where the composite bumps and the solder layer were formed on the substrate input/output pads prior to soldering.

FIGS. 3 and 4 show another embodiment of the bonded structure. As shown in FIG. 3 the composite bumps are formed on the substrate 20 input/output pads 24 which are a metal such as aluminum about 90 microns in diameter. Each composite bump is composed of a polymer body 32 such as polyamic acid polyimide with a thickness between about 5 and 25 microns, a conductive metal coating 36 covering the polymer body, and a soldering metal coating 38 covering the conductive metal coating. The conductive metal coating must adhere to the polymer body and can be a composite such as chrome/copper/gold, chrome/nickel/gold, chrome/silver/gold, titanium/tungsten/gold, titanium/platinum/gold, or titanium/palladium/gold. For chrome/copper/gold the thickness can be about 500 Angstroms chrome/500 Angstroms copper/2000 Angstroms gold. The soldering metal layer can be metal alloys such as lead-tin, indium-gallium, or indium-tin. For lead-tin the soldering metal layer can be 95% lead-5% tin with a thickness of between about 1 and 20 microns. Integrated circuit element input/output pads 26 are formed on the integrated circuit element 30 and are formed from a metal the solder will wet such as chrome/copper gold or other metal composites used for the conductive metal coating on the polymer body of the composite bump. FIG. 4 shows the bonded structure after soldering. The soldering metal 38 bonds the composite bump structure to the integrated circuit element input/output pads 26.

Figure 5:
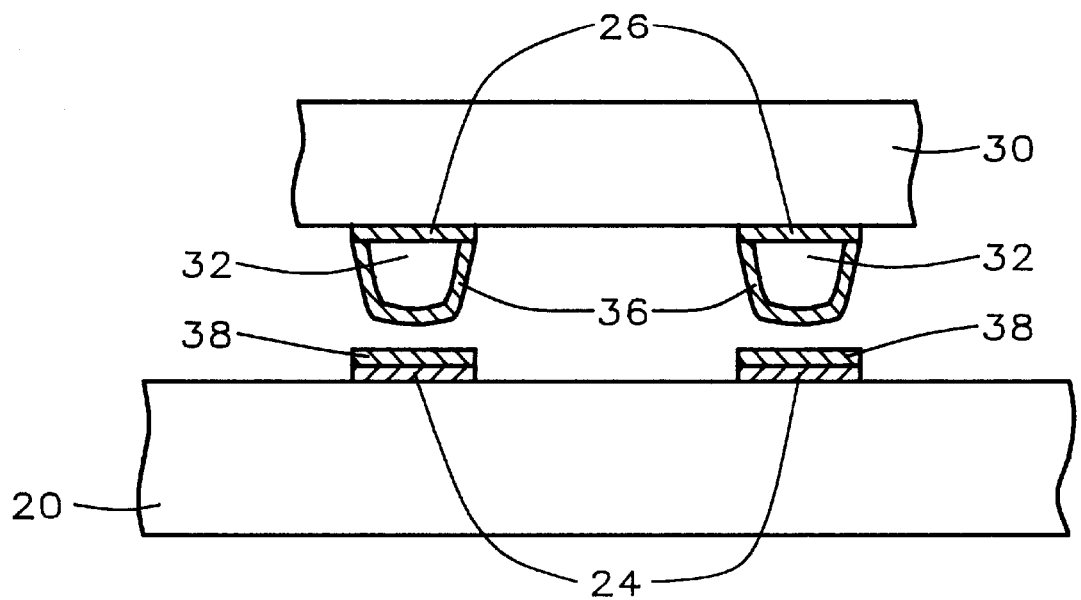
FIG. 5 is a cross sectional representation of composite bumps formed on the integrated circuit element input/output pads and a solder layer formed on the substrate input/output pads prior to soldering.
Figure 6:
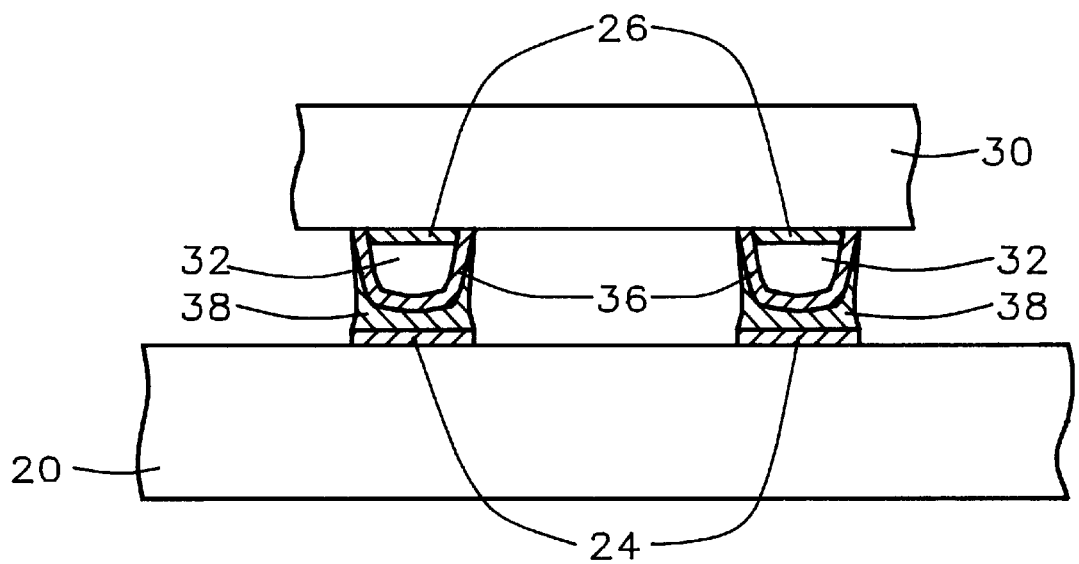
FIG. 6 is a cross sectional representation of the structure after soldering where composite bumps were formed on the integrated circuit element input/output pads and the solder was formed on the substrate input/output pads prior to soldering.

FIGS. 5 and 6 show another embodiment of the bonded structure. As shown in FIG. 5 the composite bumps are formed on the integrated circuit element input/output pads 26 which are a metal such as aluminum about 90 microns in diameter. Each composite bump is composed of a polymer body 32 such as polyamic acid polyimide with a thickness between about 5 and 25 microns and a conductive metal coating 36 covering the polymer body. The conductive metal coating must adhere to the polymer body and can be a composite such as chrome/copper/gold, chrome/nickel/gold, chrome/silver/gold, titanium/tungsten/gold, titanium/platinum/gold, or titanium/palladium/gold. For chrome/copper/gold the thickness can be about 500 Angstroms chrome/500 Angstroms copper/2000 Angstroms gold. The soldering metal 38 is formed on the substrate 20 input/output pads 24 which must be a metal wettable by the solder, for example copper. The soldering metal can be 95% lead-5% tin, other alloys of lead-tin, alloys of indium-gallium, or alloys of indium-tin. FIG. 6 shows the bonded structure after soldering. The soldering metal 38 bonds the composite bump structure to the substrate input/output pads 24.

Figure 7:
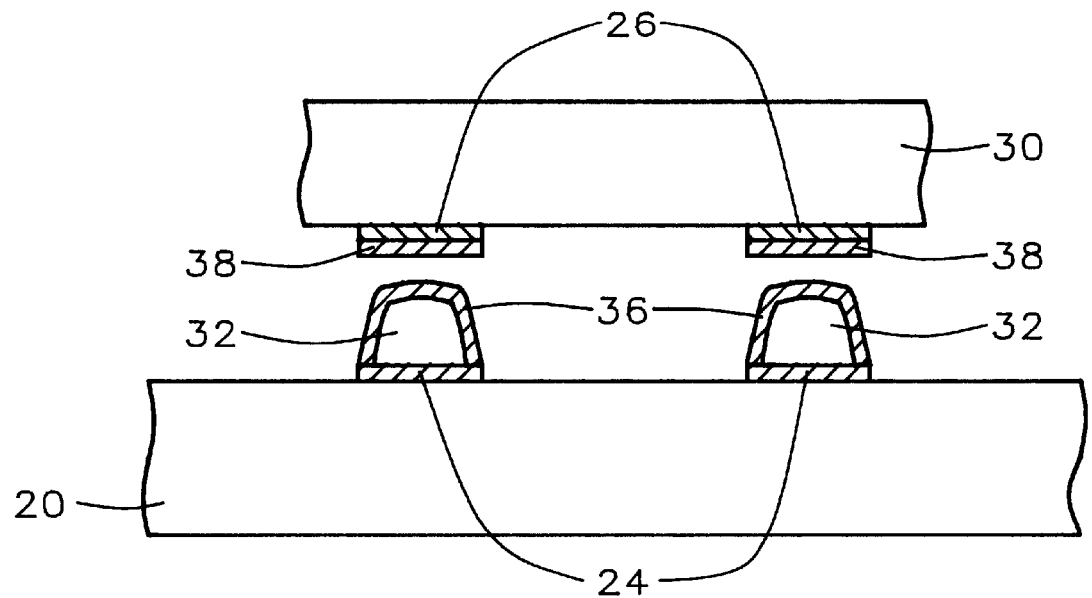
FIG. 7 is a cross sectional representation of composite bumps formed on the substrate input/output pads and a solder layer formed on the integrated circuit element input/output pads prior to soldering.
Figure 8:
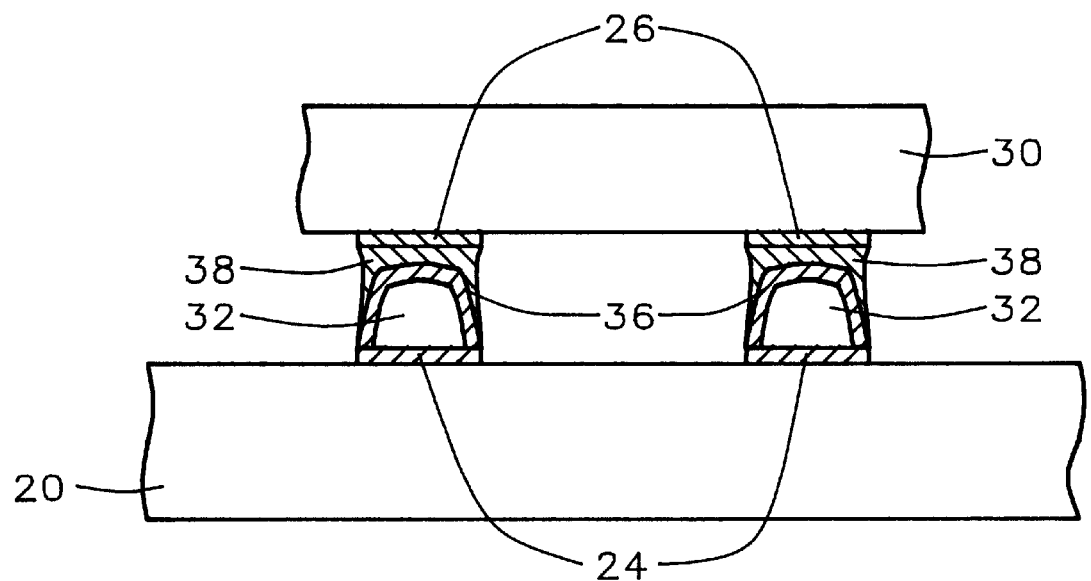
FIG. 8 is a cross sectional representation of the structure after soldering where composite bumps were formed on the substrate input/output pads and the solder was formed on the integrated circuit element input/output pads prior to soldering.

FIGS. 7 and 8 show another embodiment of the bonded structure. As shown in FIG. 7 the composite bumps are formed on the substrate 20 input/output pads 24 which are metal such as aluminum and about 90 microns in diameter. Each composite bump is composed of a polymer body 32 such as polyamic acid polyimide with a thickness between about 5 and 25 microns and a conductive metal coating 36 covering the polymer body. The conductive metal coating must adhere to the polymer body and can be a composite such as chrome/copper/gold, chrome/nickel/gold, chrome/silver/gold, titanium/tungsten/gold, titanium/platinum/gold, or titanium/palladium/gold. For chrome/copper/gold the thickness can be about 500 Angstroms chrome/500 Angstroms copper/2000 Angstroms gold. The soldering metal 38 is formed on the integrated circuit element 30 input/output pads 26 which must be a metal wettable by the solder, for example chrome/copper/gold or other composites used as the conductive metal coating covering the polymer body. The soldering metal can be 95% lead-5% tin, other alloys of lead-tin, alloys of indium-gallium, or alloys of indium-tin. FIG. 8 shows the bonded structure after soldering. The soldering metal 38 bonds the composite bump structure to the integrated circuit element input/output pads 26.

FIGS. 1 and 2 show an embodiment of a method of forming the bonded structure of the current invention. As shown in FIG. 1 composite bumps are formed on the integrated circuit element input/output pads 26 which are a metal such as aluminum. Each composite bump is composed of a polymer body 32 such as polyamic acid polyimide, a conductive metal coating 36 covering the polymer body, and a soldering metal coating 38 covering the conductive metal coating. The conductive metal coating must adhere to the polymer body and can be a composite such as chrome/copper/gold, chrome/nickel/gold, chrome/silver/gold, titanium/tungsten/gold, titanium/platinum/gold, or titanium/palladium/gold. For chrome/copper/gold the thickness can be about 500 Angstroms chrome/500 Angstroms copper/2000 Angstroms gold. The soldering metal layer 38 can be metal alloys such as lead-tin, indium-gallium, or indiumtin. For lead-tin the soldering metal layer can be 95% lead-5% tin with a thickness of between about 1 and 20 microns. Substrate input/output pads 24 are formed on the substrate 20 and are formed from a metal the solder will wet such chrome/copper/gold or other metal composites used for the conductive metal coating on the polymer body of the composite bump.

The integrated circuit element 30 and the substrate 20 are then brought together so that the composite bumps are brought together with the substrate input/output pads 24. Heat is applied to the soldering metal 38 thereby raising its temperature to about 30° C. above the melting point of the soldering metal used. For the 95% lead-5% tin solder alloy the temperature is raised to about 350° C. The soldering metal melts wetting the substrate input/out pads 24, the heat is removed, and as the solder cools below the melting point the bonded structure is formed. Due to the low Young's Modulus of the polymer body the stress tending to break the solder joint during or after the soldering process is extremely small.

FIGS. 3 and 4 show another embodiment of a method of forming the bonded structure. As shown in FIG. 3 the composite bump is formed on the substrate 20 input/output pad 24 prior to bonding. The composite bump includes a polymer body 32, a conductive metal coating 36, and a soldering metal coating 38 such as alloys of lead-tin, indium-gallium, or indium-tin. The integrated circuit element 30 input/output pad 26 is formed from a metal wettable by the solder used.

The integrated circuit element 30 and the substrate 20 are then brought together so that the composite bumps are brought together with the integrated circuit element 30 input/output pads 24. Heat is applied to the soldering metal 38 thereby raising its temperature to about 30° C. above the melting point of the soldering metal used. For the 95% lead-5% tin solder alloy the temperature is raised to about 350° C. The soldering metal melts wetting the integrated circuit element input/out pads 26, the heat is removed, and as the solder cools below the melting point the bonded structure is formed. Due to the low Young's Modulus of the polymer body the stress tending to break the solder joint during or after the soldering process is extremely small.

FIGS. 5 and 6 show another embodiment of a method of forming the bonded structure. As shown in FIG. 5 the composite bump is formed on the integrated circuit element 30 input/output pads 26 prior to bonding. The composite bump includes a polymer body 32 and a conductive metal coating 36. A soldering metal coating 38, such as alloys of lead-tin, indium-gallium, or indium-tin, is formed on the substrate 20 input/output pads 24. The substrate 20 input/output pads 24 are formed from a metal wettable by the solder used. The integrated circuit element 30 and the substrate 20 are then brought together so that the composite bumps are brought together with the substrate 20 input/output pads 24. The soldering process then proceeds as described in the previous embodiments.

FIGS. 7 and 8 show another embodiment of a method of forming the bonded structure. As shown in FIG. 7 the composite bump is formed on the substrate 20 input/output pads 24 prior to bonding. The composite bump includes a polymer body 32 and a conductive metal coating 36. A soldering metal coating 38, such as alloys of lead-tin, indium-gallium, or indium-tin, is formed on the integrated circuit element 30 input/output pads 26. The integrated circuit element 30 input/output pads 26 are formed from a metal wettable by the solder used. The integrated circuit element 30 and the substrate 20 are then brought together so that the composite bumps are brought together with the integrated circuit element 30 input/output pads 26. The soldering process then proceeds as described in the previous embodiments.

While the invention has been particularly shown and described with reference to the preferred embodiments thereof, it will be understood by those skilled in the art that various changes in form and details may be made without departing from the spirit and scope of the invention.

What is claimed is:

1. A bonded structure, comprising:
    an integrated circuit element having input/output pads;
    a substrate having input/output pads; and
    a plurality of physical and electrical connections between said integrated circuit element input/output pads and said substrate input/output pads wherein each said connection includes a soldering metal and a composite bump comprised of a single polymer body with a conductive metal coating covering said polymer body wherein said physical and electrical connections are formed by said soldering metal.

2. The bonded structure of claim 1 wherein said polymer is polyamic acid polyimide.

3. The bonded structure of claim 1 wherein said conductive metal coating is a composite of chrome/copper/gold having thicknesses of about 500 Angstroms chrome/500 Angstroms copper/2000 Angstroms gold.

4. The bonded structure of claim 1 wherein said soldering metal is 95% lead-5% tin.

* * * * *